(12) United States Patent
Aisenbrey (10) Patent No.: US 7,017,822 B2
(45) Date of Patent: *Mar. 28, 2006

(54) LOW COST RFID ANTENNA MANUFACTURED FROM CONDUCTIVE LOADED RESIN-BASED MATERIALS

(75) Inventor: Thomas Aisenbrey, Littleton, CO (US)

(73) Assignee: Integral Technologies, Inc., Bellingham, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/933,030

(22) Filed: Sep. 2, 2004

(65) Prior Publication Data
US 2005/0024290 A1    Feb. 3, 2005

Related U.S. Application Data

(63) Continuation-in-part of application No. 10/075,778, filed on Feb. 14, 2002, now Pat. No. 6,741,221, and a continuation-in-part of application No. 10/309,429, filed on Dec. 4, 2002, now Pat. No. 6,870,516.

(60) Provisional application No. 60/499,427, filed on Sep. 2, 2003, provisional application No. 60/317,808, filed on Sep. 7, 2001, provisional application No. 60/269,414, filed on Feb. 16, 2001, provisional application No. 60/268,822, filed on Feb. 15, 2001.

(51) Int. Cl.
*G06K 19/00*    (2006.01)

(52) U.S. Cl. ................... 235/487; 235/492; 235/380

(58) Field of Classification Search ............. 235/487, 235/492, 493, 488, 380, 382, 382.5, 375; 343/711, 713, 793, 873, 702, 900, 897
See application file for complete search history.

(56) References Cited

U.S. PATENT DOCUMENTS

| | | | |
|---|---|---|---|
| 6,032,127 A | 2/2000 | Schkolnick et al. | 705/23 |
| 6,078,791 A | 6/2000 | Tuttle et al. | 455/90 |
| 6,411,213 B1 | 6/2002 | Vega et al. | 340/573.3 |
| 6,447,294 B1 * | 9/2002 | Price | 433/167 |
| 6,466,131 B1 | 10/2002 | Tuttle et al. | 340/572.7 |
| 6,741,178 B1 | 5/2004 | Tuttle | 340/572.1 |
| 6,870,516 B1 * | 3/2005 | Aisenbrey | 343/873 |
| 2001/0054755 A1 | 12/2001 | Kirkham | 257/678 |
| 2002/0125997 A1 * | 9/2002 | Kashi et al. | 340/10.52 |
| 2002/0163434 A1 | 11/2002 | Burke | 340/572.7 |
| 2003/0069793 A1 | 4/2003 | Rudolph et al. | 705/19 |
| 2004/0074974 A1 | 4/2004 | Senba et al. | 235/492 |

* cited by examiner

Primary Examiner—Karl D. Frech
(74) Attorney, Agent, or Firm—Douglas R. Schnabel (57) ABSTRACT

RFID antennas are formed of a conductive loaded resin-based material. The conductive loaded resin-based material comprises micron conductive powder(s), conductive fiber(s), or a combination of conductive powder and conductive fibers in a base resin host. The percentage by weight of the conductive powder(s), conductive fiber(s), or a combination thereof is between about 20% and 50% of the weight of the conductive loaded resin-based material. The micron conductive powders are formed from non-metals, such as carbon, graphite, that may also be metallic plated, or the like, or from metals such as stainless steel, nickel, copper, silver, that may also be metallic plated, or the like, or from a combination of non-metal, plated, or in combination with, metal powders. The micron conductor fibers preferably are of nickel plated carbon fiber, stainless steel fiber, copper fiber, silver fiber, or the like.

98 Claims, 9 Drawing Sheets

LOW COST RFID ANTENNA MANUFACTURED FROM CONDUCTIVE LOADED RESIN-BASED MATERIALS

This Patent Application claims priority to the U.S. Provisional Patent Application 60/499,427, filed on Sep. 2, 2003, which is herein incorporated by reference in its entirety.

This Patent Application is a Continuation-in-Part of U.S. patent application Ser. No. 10/309,429, filed on Dec. 4, 2002 now U.S. Pat. No. 6,870,516, also incorporated by reference in its entirety, which is a Continuation-in-Part application, filed as U.S. patent application Ser. No. 10/075,778, filed on Feb. 14, 2002 now U.S. Pat. No. 6,741,221, which claimed priority to U.S. Provisional Patent Applications Ser. No. 60/317,808, filed on Sep. 7, 2001, Ser. No. 60/269,414, filed on Feb. 16, 2001, and Ser. No. 60/268,822, filed on Feb. 15, 2001.

BACKGROUND OF THE INVENTION (1) Field of the Invention

This invention relates to radio frequency identification devices and, more particularly, to radio frequency identification devices molded of conductive loaded resin-based materials comprising micron conductive powders, micron conductive fibers, or a combination thereof, homogenized within a base resin when molded. This manufacturing process yields a conductive part or material usable within the EMF or electronic spectrum(s).

(2) Description of the Prior Art

Radio frequency identification devices (RFID) are becoming increasingly popular for a variety of industrial, retail, transportation, and other applications. RFID technology provides a positive identify for any object, person, or the like, bearing the RFID transponder through the use of a passive, radio frequency signal. In a typical technology, a RFID transponder comprises an antenna and an integrated circuit. When a separate, RFID reading device broadcasts a radio frequency signal, this signal interacts with the RFID transponder antenna. The transponder antenna converts part of the received RF signal energy into an electrical current. This electrical current, in turn, is detected by the integrated circuit and, in many applications, actually powers the integrated circuit. The integrated circuit then modulates this electrical current in the transponder antenna to thereby create a return RF signal. This return RF signal is then detected by the antenna in the RFID reading device. This modulated, RF return signal carries encoded data about the transponder based on the data previously stored in the integrated circuit. For example, the serial number of the transponder may be returned to the RFID reading device via this modulated RF signal. Finally, the RFID reading device decodes the signal returned from the transponder to complete the identification.

RFID transponders find a large and growing number of applications. Employee identity badges, animal identity devices, retail pricing and inventory devices, retail security devices, manufacturing product and material tracking devices, vehicle identification devices, and the like, are just a few examples of the growing area of applications for RFID technology. RFID transponders are ideally suited for integration onto a wide variety of products and into a wide variety of situations. RFID transponders may be purely passive devices where all of the energy for operating the integrated circuit is derived from the broadcast RF signal. Alternatively, active RFID systems incorporate an on-board battery to provide power to the identity chip and/or power for the transponder's return RF signal. In fixed systems, such as motor vehicle transponders used for automated toll collection, the additional cost of the on-board battery is easily justified by the improved performance of the device. Conversely, in very cost sensitive applications, such as retail pricing and security tags, the RFID transponder device must be as inexpensive as possible and, therefore, must be a passive system.

The on-board antenna is a key enabling technology for RFID transponder devices. The broadcast RF energy may be in the form of a magnetic field, an electric field, or a mixed field as in typical radio signal broadcast. The transponder antenna is designed with a shape and a size based on the characteristics of the broadcast RF energy such as the field type and the signal frequency. In many applications, this transponder antenna is manufactured as a spiral, or loop, structure to maximize magnetic field interaction and energy transfer. Two general types of antenna material are used: metal and conductive ink. Metal antennas are typically formed either as a three-dimensional coil, as found in plastic in-store anti-theft devices, or as a two-dimensional spiral structure, as found in employee badges. Metal coil antennas are formed by winding metal wire onto a core or frame to create a coil. Coils are large and expensive to manufacture. Flat metal antennas are typically formed from a thin layer of metal, such as copper or aluminum, which is laminated onto an insulating substrate material. This metal layer is chemically etched to form the desired pattern. Further, to provide connectivity between the two ends of a spiral antenna and the identity chip, a second conductive layer must be defined. The two-dimensional spiral antenna provides a much smaller antenna that is well-suited to smaller transponder designs. However, the manufacturing cost is still too high for many applications.

The second conductive layer in a flat metal antenna comprises a conductive ink in some prior art designs. This conductive ink may further be applied to the formation of the spiral antenna itself. Conductive ink may be applied using screen printing techniques. However, conductive ink has disadvantages. First, conductive inks are of higher resistivity than metal and, therefore, result in lossy antennas. In a passive RFID transponder, the system performance is directly related to efficient RF energy reception and conversion. Conductive ink antennas provide reduced system performance due to resistive losses. Second, spiral conductive ink antennas require two conductive ink layers separated by an insulating ink layer to complete the circuit connectivity. The manufacturing process requires multiple steps and tooling and requires that the ink layers maintain layer-to-layer registration. As a result, the manufacturing process can be complex and expensive. It is a key objective of the present invention to provide a RFID antenna structure and a method of manufacture that each improve upon the present art.

Several prior art inventions relate to RFID transponders and methods of manufacture. U.S. patent Publication 2002/0163434 A1 to Burke teaches an RFID tag with a metallized dielectric substrate. U.S. Pat. No. 6,078,791 to Tuttle et al teaches a radio frequency identification transceiver and antenna that utilizes a conductive polymer material to connect a crossed antenna structure. U.S. Pat. No. 6,741,178 B1 to Tuttle teaches an electrically powered postage stamp or mailing or shipping label operative with radio frequency communication.

U.S. Pat. No. 6,466,131 B1 to Tuttle et al teaches a radio frequency data communication device with adjustable receiver sensitivity and a method of manufacture. This invention teaches an antenna that is silk screened onto an ID card with a conductive polymer thick film. U.S. patent Publication 2004/0074974 A1 to Senba et al teaches a RFID housing structure made of a conductive metal which has an excellent strength and durability that has a gap or path for the electromagnetic waves to be able to communicate with a read/write terminal. U.S. Pat. No. 6,032,127 to Schkolnick et al teaches an intelligent shopping cart utilizing a radio frequency base station and antenna and is able to communicate with the RFID tags on the items in the cart, total the price of the items, and accept payment as well as communicate with the main terminal in the store.

U.S. patent Publication 2001/0054755 A1 to Kirkham teaches an integrated package and RFID antenna utilizing conductive resins, conductive inks, conductive polymers or metals in the package and capacitively coupling the package to the RFID antenna to create a much larger antenna. U.S. patent Publication 2003/0069793 A1 to Rudolph et al teaches a tax stamp authentication and product control RFID tag for Cigarette packaging that utilizes an antenna comprising a conductive ink, conductive resin, conductive polymer and mixtures thereof. U.S. Pat. No. 6,411,213 B1 to Vega et al teaches a radio frequency identification tag system using tags arranged for coupling to ground that utilizes a back plate formed from conductive plastic to enhance electrical coupling of radio frequency identification tag to the body of the animal or person.

SUMMARY OF THE INVENTION

A principal object of the present invention is to provide an effective RFID device.

A further object of the present invention is to provide a method to form a RFID device.

A further object of the present invention is to provide a RFID antenna molded of conductive loaded resin-based materials.

A yet further object of the present invention is to provide a RFID antenna molded of conductive loaded resin-based material where the antenna characteristics can be altered or the visual characteristics can be altered by forming a metal layer over the conductive loaded resin-based material.

A yet further object of the present invention is to provide methods to fabricate a RFID device from a conductive loaded resin-based material incorporating various forms of the material.

A yet further object of the present invention is to provide a method to fabricate a RFID device from a conductive loaded resin-based material where the material is in the form of a fabric.

A yet further object of the present invention is to provide several methods to interface the conductive loaded resin-based antenna and the identification device.

In accordance with the objects of the present invention, a RFID device is achieved. The device comprises an identifier circuit and an antenna connected to the identifier circuit. The antenna comprises a conductive loaded, resin-based material comprising conductive materials in a base resin host.

Also in accordance with the objects of the present invention, a RFID device is achieved. The device comprises an identifier circuit and an antenna molded onto to the identifier circuit. The antenna comprises a conductive loaded, resin-based material comprising conductive materials in a base resin host. The percent by weight of the conductive materials is between about 20% and about 50% of the total weight of the conductive loaded resin-based material.

Also in accordance with the objects of the present invention, a method to form a RFID device is achieved. The method comprises providing an identifying device and a conductive loaded, resin-based material comprising conductive materials in a resin-based host. The conductive loaded, resin-based material is molded to form an antenna device connected to the identifying device.

BRIEF DESCRIPTION OF THE DRAWINGS

In the accompanying drawings forming a material part of this description, there is shown.

DESCRIPTION OF THE PREFERRED EMBODIMENTS

This invention relates to RFID devices molded of conductive loaded resin-based materials comprising micron conductive powders, micron conductive fibers, or a combination thereof, homogenized within a base resin when molded.

The conductive loaded resin-based materials of the invention are base resins loaded with conductive materials, which then makes any base resin a conductor rather than an insulator. The resins provide the structural integrity to the molded part. The micron conductive fibers, micron conductive powders, or a combination thereof, are homogenized within the resin during the molding process, providing the electrical continuity.

The conductive loaded resin-based materials can be molded, extruded or the like to provide almost any desired shape or size. The molded conductive loaded resin-based materials can also be cut, stamped, or vacuumed formed from an injection molded or extruded sheet or bar stock, over-molded, laminated, milled or the like to provide the desired shape and size. The thermal or electrical conductivity characteristics of RFID devices fabricated using conductive loaded resin-based materials depend on the composition of the conductive loaded resin-based materials, of which the loading or doping parameters can be adjusted, to aid in achieving the desired structural, electrical or other physical characteristics of the material. The selected materials used to fabricate the RFID antenna devices are homogenized together using molding techniques and or methods such as injection molding, over-molding, insert molding, thermoset, protrusion, extrusion or the like. Characteristics related to 2D, 3D, 4D, and 5D designs, molding and electrical characteristics, include the physical and electrical advantages that can be achieved during the molding process of the actual parts and the polymer physics associated within the conductive networks within the molded part(s) or formed material(s).

The use of conductive loaded resin-based materials in the fabrication of RFID transponders significantly lowers the cost of materials and the design and manufacturing processes used to hold ease of close tolerances, by forming these materials into desired shapes and sizes. The RFID transponder can be manufactured into infinite shapes and sizes using conventional forming methods such as injection molding, over-molding, or extrusion or the like. The conductive loaded resin-based materials, when molded, typically but not exclusively produce a desirable usable range of resistivity from between about 5 and 25 ohms per square, but other resistivities can be achieved by varying the doping parameters and/or resin selection(s).

The conductive loaded resin-based materials comprise micron conductive powders, micron conductive fibers, or any combination thereof, which are homogenized together within the base resin, during the molding process, yielding an easy to produce low cost, electrically conductive, close tolerance manufactured part or circuit. The micron conductive powders can be of carbons, graphites, amines or the like, and/or of metal powders such as nickel, copper, silver, or plated or the like. The use of carbons or other forms of powders such as graphite(s) etc. can create additional low level electron exchange and, when used in combination with micron conductive fibers, creates a micron filler element within the micron conductive network of fiber(s) producing further electrical conductivity as well as acting as a lubricant for the molding equipment. The micron conductive fibers can be nickel plated carbon fiber, stainless steel fiber, copper fiber, silver fiber, or the like, or combinations thereof. The structural material is a material such as any polymer resin. Structural material can be, here given as examples and not as an exhaustive list, polymer resins produced by GE PLASTICS, Pittsfield, Mass., a range of other plastics produced by GE PLASTICS, Pittsfield, Mass., a range of other plastics produced by other manufacturers, silicones produced by GE SILICONES, Waterford, N.Y., or other flexible resin-based rubber compounds produced by other manufacturers.

The resin-based structural material loaded with micron conductive powders, micron conductive fibers, or in combination thereof can be molded, using conventional molding methods such as injection molding or over-molding, or extrusion to create desired shapes and sizes. The molded conductive loaded resin-based materials can also be stamped, cut or milled as desired to form create the desired shape form factor(s) of the RFID structure. The doping composition and directionality associated with the micron conductors within the loaded base resins can affect the electrical and structural characteristics of the RFID antenna and can be precisely controlled by mold designs, gating and or protrusion design(s) and or during the molding process itself. In addition, the resin base can be selected to obtain the desired thermal characteristics such as very high melting point or specific thermal conductivity.

A resin-based sandwich laminate could also be fabricated with random or continuous webbed micron stainless steel fibers or other conductive fibers, forming a cloth like material. The webbed conductive fiber can be laminated or the like to materials such as Teflon, Polyesters, or any resin-based flexible or solid material(s), which when discretely designed in fiber content(s), orientation(s) and shape(s), will produce a very highly conductive flexible cloth-like material. Such a cloth-like material could also be used in forming RFID devices that could be embedded in a person's clothing as well as other resin materials such as rubber(s) or plastic(s). When using conductive fibers as a webbed conductor as part of a laminate or cloth-like material, the fibers may have diameters of between about 3 and 12 microns, typically between about 8 and 12 microns or in the range of about 10 microns, with length(s) that can be seamless or overlapping.

The conductive loaded resin-based material of the present invention can be made resistant to corrosion and/or metal electrolysis by selecting micron conductive fiber and/or micron conductive powder and base resin that are resistant to corrosion and/or metal electrolysis. For example, if a corrosion/electrolysis resistant base resin is combined with stainless steel fiber and carbon fiber/powder, then a corrosion and/or metal electrolysis resistant conductive loaded resin-based material is achieved. Another additional and important feature of the present invention is that the conductive loaded resin-based material of the present invention may be made flame retardant. Selection of a flame-retardant (FR) base resin material allows the resulting product to exhibit flame retardant capability. This is especially important in RFID applications as described herein.

The homogeneous mixing of micron conductive fiber and/or micron conductive powder and base resin described in the present invention may also be described as doping. That is, the homogeneous mixing converts the typically non-conductive base resin material into a conductive material. This process is analogous to the doping process whereby a semiconductor material, such as silicon, can be converted into a conductive material through the introduction of donor/acceptor ions as is well known in the art of semiconductor devices. Therefore, the present invention uses the term doping to mean converting a typically non-conductive base resin material into a conductive material through the homogeneous mixing of micron conductive fiber and/or micron conductive powder into a base resin.

As an additional and important feature of the present invention, the molded conductor loaded resin-based material exhibits excellent thermal dissipation characteristics. Therefore, RFID devices manufactured from the molded conductor loaded resin-based material can provide added thermal dissipation capabilities to the application. For example, heat can be dissipated from electrical devices physically and/or electrically connected to an RFID device of the present invention.

The conductive loaded resin-based material can be contacted in any of several ways. In one embodiment, a pin is embedded into the conductive loaded resin-based material by insert molding, ultrasonic welding, pressing, or other means. A connection with a metal wire can easily be made to this pin and results in excellent contact to the conductive loaded resin-based material. In another embodiment, a hole is formed in to the conductive loaded resin-based material either during the molding process or by a subsequent process step such as drilling, punching, or the like. A pin is then placed into the hole and is then ultrasonically welded to form a permanent mechanical and electrical contact. In yet another embodiment, a pin or a wire is soldered to the conductive loaded resin-based material. In this case, a hole is formed in the conductive loaded resin-based material either during the molding operation or by drilling, stamping, punching, or the like. A solderable layer is then formed in the hole. The solderable layer is preferably formed by metal plating. A conductor is placed into the hole and then mechanically and electrically bonded by point, wave, or reflow soldering.

Figure 1:
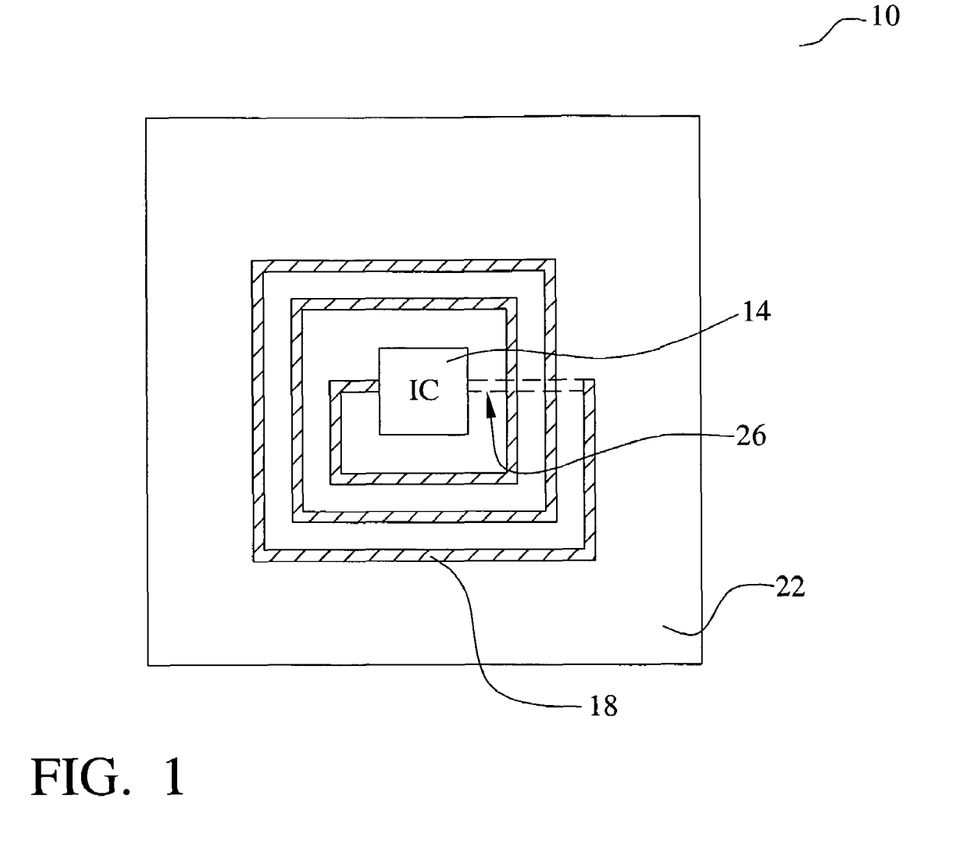
FIG. 1 illustrates a first preferred embodiment of the present invention showing a RFID transponder device comprising a conductive loaded resin-based material.

Referring now to FIG. 1, a first preferred embodiment of the present invention is illustrated. Several important features of the present invention are shown and discussed below. Referring now to FIG. 1, a radio frequency identification device (RFID) 10 is shown in top view. The RFID device 10 shown is a transponder device that can be easily integrated onto a large variety of manufactured articles. The RFID transponder 10 comprises an antenna 18 and an identification chip 14. The antenna 18 and identification chip 14 are electrically connected together and are mechanically fixed to a substrate 22.

According to an important feature of the present invention, the antenna 18 comprises the conductive loaded resin-based material described herein. The conductive loaded resin-based material provides an easily moldable yet very conductive material for forming the antenna 18. The conductive loaded resin-based material bears a complex matrix of conductive fiber and/or powder that exhibits excellent absorption of RF energy. Further, the specific dielectric properties of the conductive loaded resin-based material create an antenna 18 that is minimally affected by near field objects. As a result, the conductive loaded resin-based antenna 18 displays a large, but tunable, bandwidth, excellent reception and transmission properties, and is ideally suited to many difficult applications. The low resistivity of the conductive loaded resin-based material provides substantially better performance than typical conductive inks. In fact, the conductive loaded resin-based material outperforms all-metal antennas, such as formed by two-dimensional metal layers, due to the molecular interaction of the network of conductive material and the base resin material.

In addition to performance factors, the conductive loaded resin-based antenna 18 is easier to manufacture. The antenna 18 is produced using a simple molding process as is discussed below. Multiple screen printing and/or etching processes and complex layer registration issues are avoided. As a result, a manufacturing process of reduced complexity, tooling, and manufacturing steps is achieved.

In the preferred embodiment illustrated, the conductive loaded resin-based material antenna 18 is in a spiral, or multi-loop, pattern, as shown, or in a serpentine pattern. These patterns are found to be particularly useful for detecting and converting magnetic field energy and/or to create an antenna with the desired wavelength. A wide variety of other antenna patterns, such as serpentine, may be used as dictated by the type of RF field, the strength of the RF field, the frequency of the RF field, and the desired size and shape of the completed transponder device. Monopole designs, dipole designs, PIFA's, inverted 'F' designs, planar designs, and the like, may be used. In addition, counterpoise structures and/or ground plane structures, not shown, may easily be molded into the conductive loaded resin-based antenna structure 18. In the particular example, a spiral antenna 18 depicted, it is necessary to create a second conductive level 26 to connect each end of the antenna 18 to the identifying chip 14. In one embodiment, which will be described below, this second conductive level simply comprises the conductive loaded resin-based material molded onto the underside of the substrate 22. According to another embodiment, this second conductive level comprises a conductive ink line. In another embodiment, a metal wire, trace line, or the like, is used.

The identifier chip 14 preferably comprises an integrated circuit device capable of storing multiple bits of data and capable of modulating the current in the transponder antenna 18 to thereby encode this data onto the RF signal. In one embodiment, the identifier chip 14 comprises a semiconductor-based device, such as a silicon chip, with active and/or passive devices such as transistors, resistors, capacitors, and the like, integrated thereon. For example, an integrated circuit device 14 having the ability to store and to encode 64 bits, 96 bits, or more, of data is used in this embodiment. According to one embodiment, the identifier device 14 comprises a passive network of resistors, capacitors, and/or inductors that exhibits a resonance response to the incoming RF signal. According to another embodiment, the identifier device 14 comprises a diode device to simply rectify the incoming RF signal. According to one embodiment, the identifier device 14 bears a fixed response frequency and/or identifying data pattern. According to another embodiment, the response frequency and/or identifying data pattern is programmable and/or re-programmable.

Figure 10:
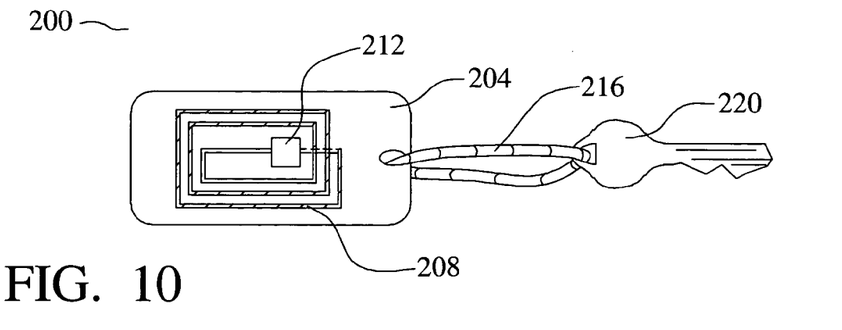
FIG. 10 illustrates a fifth preferred embodiment of the present invention showing a RFID transponder integrated into a key chain.

The substrate 22 preferably comprises a non-conductive material such that the conductive antenna 18 is mechanically supported by the substrate 22 while not being electrically shorted to the substrate 22. In the preferred embodiment, conductive loaded resin-based material antenna 18 is molded onto the substrate 22. According to one embodiment of the present invention, the identifier chip 14 is electrically connected to the antenna 18 by the molding process. In addition, the identifying chip is held onto the substrate 22 by this molding step. According to another embodiment, the identifier chip 14 is attached to the substrate 22 by an adhesive such as an epoxy material. According to a preferred embodiment, the substrate 22 comprises a resin-based material, not doped, and, more preferably, comprises the same base resin as is used in the conductive loaded resin-based material of the antenna 18 to promote excellent bonding between the substrate 22 and the antenna 18. According to another embodiment, the substrate 22 comprises a mechanical feature of the final manufactured article. For example, the substrate 22 comprises the mechanical form for a key chain device as is shown in FIG. 10 and is discussed below. According to another embodiment, the substrate 22 is merely a platform for holding the antenna 18 and the chip 14. In this case, the substrate 22 is then embedded into, or attached onto, a larger manufactured item. The substrate 22 may be rigid or flexible based on the properties of the substrate material 22.

Figure 7A:
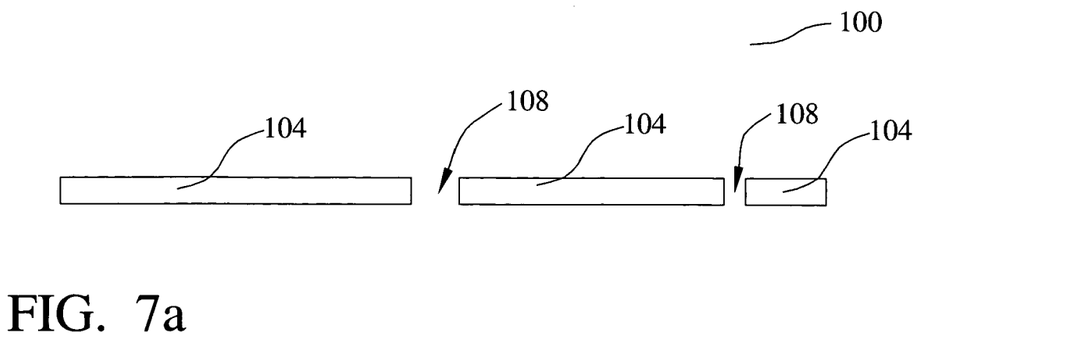
FIGS. 7a through 7c illustrate a second preferred embodiment of the present invention showing, in cross sectional representation, a method to form a RFID transponder device.
Figure 7B:
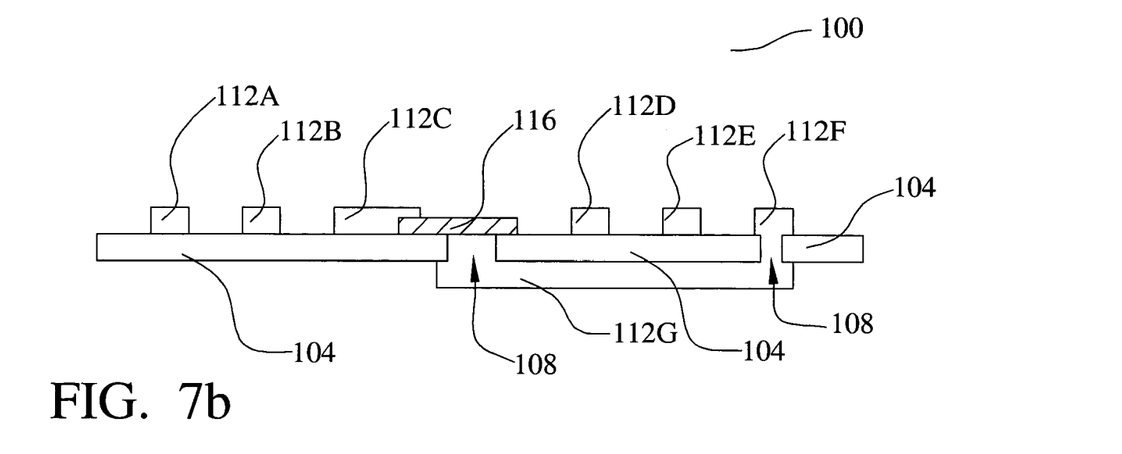
Figure 7C:
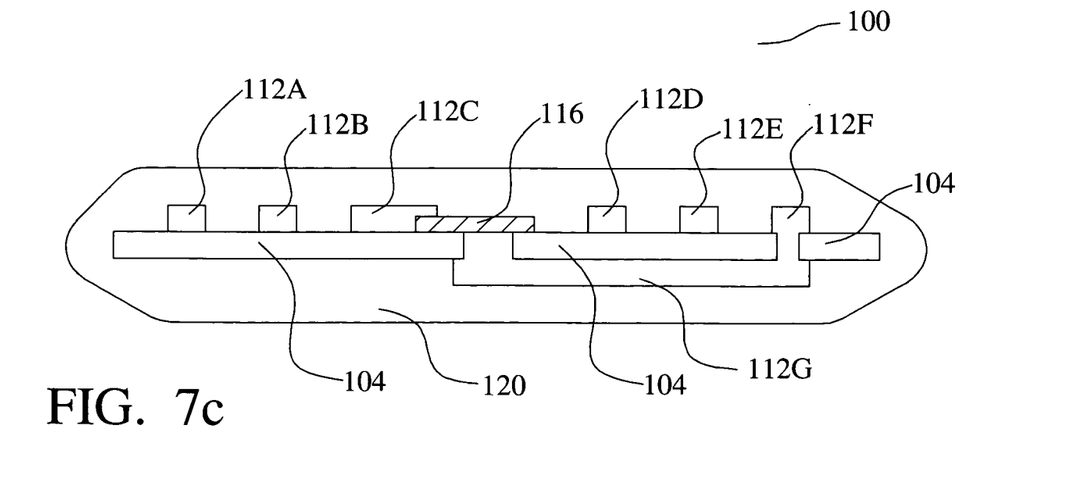

Referring now to FIGS. 7a through 7c, a second preferred embodiment of the present invention is illustrated. A method 100 for forming a RFID transponder device is shown in cross section. Referring particularly to FIG. 7a, a substrate 104 is provided. The substrate 104 comprises an insulating material. According to one embodiment, the substrate 104 comprises a resin-based material. In this case, the substrate 104 shape and openings 108 are preferably formed by a molding process. Alternatively, the resin-based substrate 104 is first molded to a desired shape and then is perforated to form openings 108 by stamping, drilling, or the like. According to another embodiment, the substrate 108 comprises a non-resin material such as ceramic or fiberglass. According to yet another embodiment, no substrate is provided and the RFID antenna is merely molded directly to the identifier chip without a mechanical substrate.

Referring now to FIG. 7b, several important features of the present invention are illustrated. A conductive loaded resin-based material antenna 112a through 112g is molded onto the substrate 104. The conductive loaded resin-based antenna 112a through 112g is preferably formed by injection molding or by insert molding wherein molten conductive loaded resin-based material is molded onto the substrate 104 according to a pattern defined by a mold. According to one embodiment of the present invention, the identifier chip 116 is simultaneously molded into the antenna 112a through 112g. According to one embodiment, the identifier chip 116 is held onto the substrate 104 during the conductive loaded resin-based material molding operation. According to another embodiment, the identifier chip 116 is bonded onto the substrate 104 prior to the molding operation. According to yet another embodiment, the conductive loaded resin-based material antenna 112a through 112g is first molded and then is bonded to the identifier chip 116 via a conductive epoxy (not shown).

As an important feature of the present invention, the RFID antenna 112a through 112g directly connects to the identifier chip to complete the electrical circuit as shown. According to another embodiment, the identifier chip 116 is connected to the RFID antenna 112a through 112g via a secondary connector means such as a wire, a pin, solder, and the like. In the preferred embodiment of the RFID antenna 112a through 112g shown, a spiral, helical, or serpentine shaped antenna is formed. Therefore a series of parallel conductive loaded resin-based material segments 112a, 112b, 112c, 112d, 112e, and 112f are formed. To provide connectivity between the identifier chip 116 and the antenna 112a through 112g, a second level 112g of conductive loaded resin-based material on the underside of the substrate 104 is needed. Therefore, the openings 108 in the substrate 104 are used as through holes for the molded conductive loaded resin-based material 112g to connect the top side and the bottom side lines.

Note that the substrate 104, if resin-based, is easily formed in a first molding operation and the RFID antenna 112a through 112g is easily formed in a second molding operation. As a result, a simplified, robust, and cost effective manufacturing process is achieved. Alternative variations on this method are not depicted yet are readily achieved while remaining within the scope of the present invention. For example, a wide variety of patterned conductive loaded resin-based antennas 112a through 112h may be formed. The conductive loaded resin-based material antenna 112 may be formed on only the top side of the substrate 104. The second conductive level may comprise a conductive ink or a metal wire, pin, film, or the like.

Referring now to FIG. 7c, an insulating layer 120 is formed to encapsulate the RFID transponder device 100 is such a layer 120 is needed. According to one embodiment of the present invention, the encapsulating layer 120 comprises yet another resin-based material that is molded onto RFID antenna 112a through 112g, substrate 104, and identifier chip 116. According to another embodiment, the encapsulating layer 120 is a coating that is formed by dipping, spraying, or the like. In yet another embodiment, an adhesive layer, not shown, is applied to the RFID device 100 such that RFID device 100 is then further attached to another sub-assembly to create a more complex manufactured article. In other embodiments, the RFID device 100 is formed without an integrated substrate 104. That is, the conductive loaded resin-based RFID antenna 112a through 112g is simply molded directly onto the identifier chip 116 without an intervening substrate 104.

Figure 14:
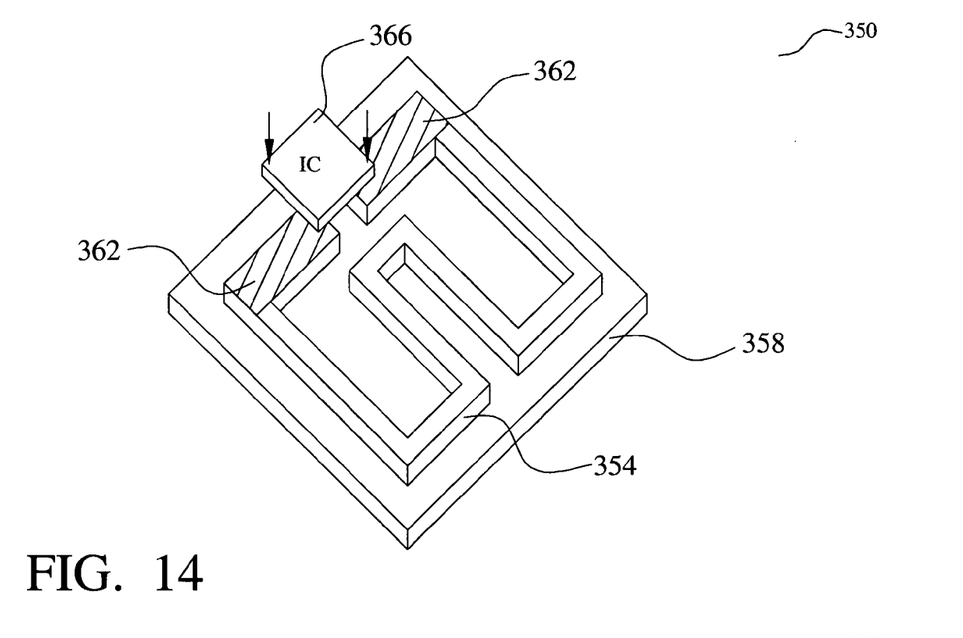
FIG. 14 illustrates a ninth preferred embodiment of the present invention showing a method to interface a conductive loaded resin-based antenna to an identification chip using a metal layer.

Referring now to FIG. 14, an alternative embodiment of the RFID transponder device 350 of the present invention is illustrated. In this case, a serpentine antenna 354 of the conductive loaded resin-based material is molded onto a substrate 358. More importantly, a metal layer 362 is selectively formed onto the conductive loaded resin-based antenna 354. This metal layer 362 creates a solderable area on each branch of the antenna 354 to facilitate soldering the identifier device 366 onto the antenna 354 to complete the RFID device 350. If such a metal layer 362 is used, then the metal layer 362 may be formed by plating or by coating. If the method of formation is metal plating, then the resin-based structural material of the conductive loaded, resin-based material is one that can be metal plated. There are many of the polymer resins that can be plated with metal layers. For example, GE Plastics, SUPEC, VALOX, ULTEM, CYCOLAC, UGIKRAL, STYRON, CYCOLOY are a few resin-based materials that can be metal plated. The metal layer 362 may be formed by, for example, electroplating or physical vapor deposition.

Figure 15:
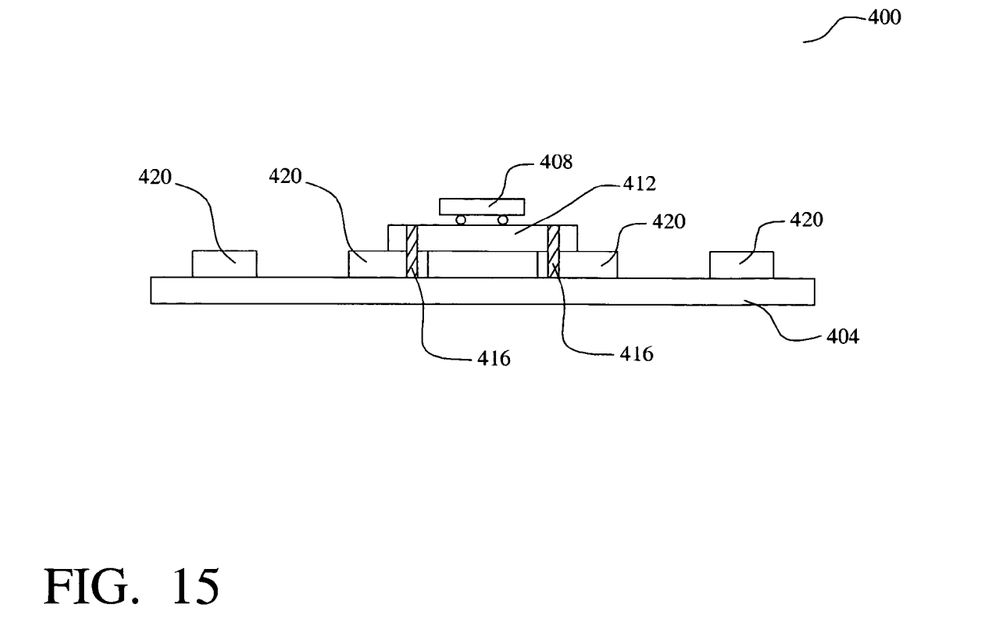
FIG. 15 illustrates a tenth preferred embodiment of the present invention showing a method to interface a conductive loaded resin-based antenna to an identification chip using a flexible circuit.

Referring now to FIG. 15, yet another embodiment of the RFID device 400 is illustrated in cross section. In this case, the identifier device 408 is mounted onto a flexible circuit 412 or chip carrier. This flexible circuit 412 comprises a flexible insulating material bearing a pattern of metal traces. The metal traces are connected to pins 416 such that, when the identifier device 408 is soldered onto the flexible circuit 412, the identifier device 408 is electrically connected to the pins 416. The conductive loaded resin-based antenna 420 is then over-molded onto the flexible circuit 412 such that the pins 416 and/or circuit traces from the flexible circuit 412 associated with the antenna 420 are embedded into the conductive loaded resin-based material. As a result, an excellent connection is made between the conductive matrix of the antenna 420 and the identifier device 408. According to another embodiment, a substrate 404 is attached by molding or by an adhesive.

Several embodiments of useful applications for the conductive loaded resin-based RFID devices of the present invention are shown in FIGS. 8a, 8b, 9a, 9b, and 10 through 13. These illustration are merely representative. Other RFID applications are either already known in the art or are easily extensible from the disclosure herein. As a most key feature, the present invention describes a new and novel antenna material for the RFID devices and a new and novel method for fabricating RFID devices using this conductive loaded resin-based material. Further, the teachings of the present invention are not merely confined to the formation of the RFID transponder devices. Similarly, the novel conductive loaded resin-based antenna may be used in RFID reading devices, broadcast only devices, and/or receive only devices. Finally, the present invention describes passive RFID devices. Alternatively, the novel conductive loaded resin-based antenna may be integrated onto active or semi-active RFID devices that further incorporate batteries, solar cells, or other power sources onto the transponder.

Figure 8A:
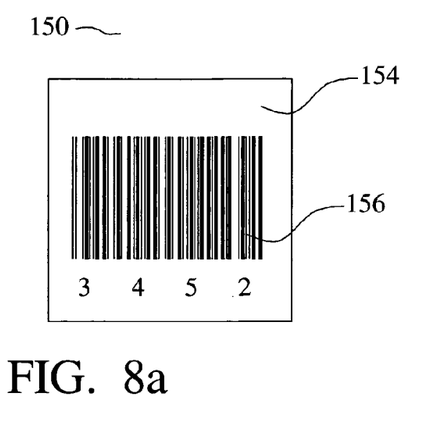
FIGS. 8a and 8b illustrate a third preferred embodiment of the present invention showing a universal product code (UPC) tag with an integrated RFID transponder comprising conductive loaded resin-based material.
Figure 8B:
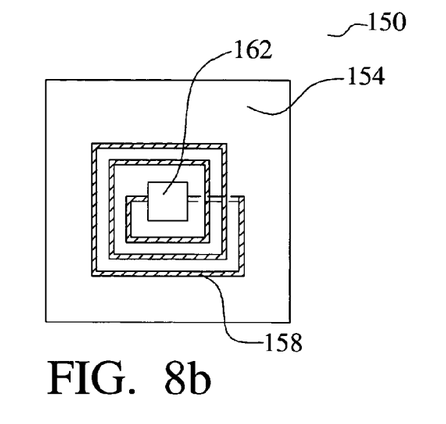

Referring now particularly to FIGS. 8a and 8b, a third preferred embodiment of the present invention is illustrated. A product label 150 is shown in front view in FIG. 8a and in reverse view in FIG. 8b. The product label 150 is shown with a UPC-type code 156 printed onto the front and with a RFID structure 158 and 162 formed onto the back. In the most preferred embodiment, the label background 154 and the RFID substrate 154 comprise the same material. That is, the RFID transponder is formed onto the substrate 154 on the reverse side either before or after the label symbols, characters, and the like, are printed onto the front side. The simplified manufacturing process and excellent performance qualities of the conductive loaded resin-based RFID antenna 158 of the present invention provides the ability to form an effective, though very small, RFID transponder onto a UPC label at a cost acceptable for retail use. According to another embodiment, the RFID transponder 158 and 162 is first formed, with or without a substrate, and then is attached to a label stock 154 using an adhesive. Alternatively, the RFID transponder 158 and 162 is first formed, with or without a substrate, and is then laminated onto the label stock 154.

Figure 9A:
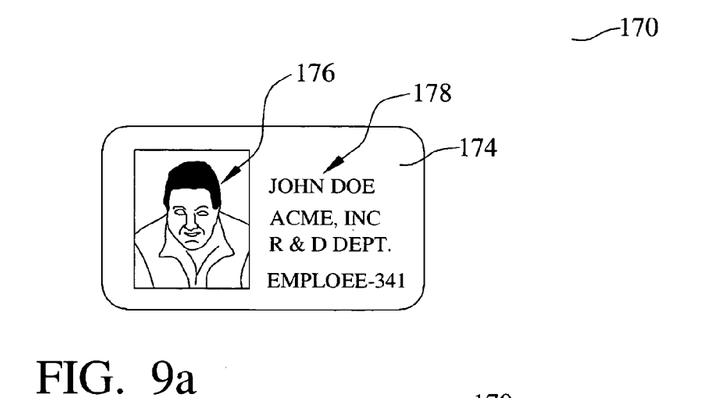
FIGS. 9a and 9b illustrate a fourth preferred embodiment of the present invention showing an employee identity badge with an integrated RFID transponder comprising conductive loaded resin-based material.
Figure 9B:
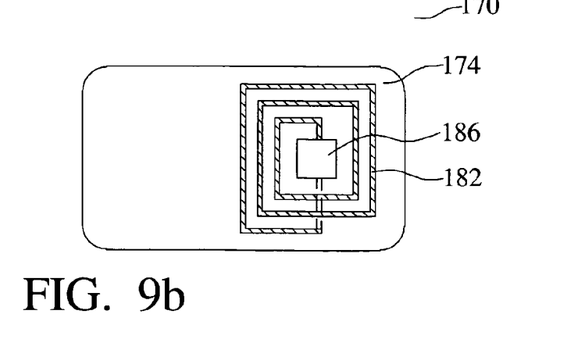

Referring now to FIGS. 9a and 9b, in a similar application, a RFID transponder 182 and 186 is formed onto/into an employee identification badge 170. The front side of the badge 170 is illustrated in FIG. 9a, while the reverse side of the badge 170 is illustrated in FIG. 9b. In the most preferred embodiment, the badge background 174 and the RFID substrate 174 comprise the same material. That is, the RFID transponder 182 and 186 is formed onto the substrate 174 on the reverse side either before or after the badge picture 176, symbols and characters 178, and the like, are printed onto the front side. The simplified manufacturing process and excellent performance qualities of the conductive loaded resin-based RFID antenna 182 of the present invention provides the ability to form an effective, though very small, RFID transponder onto a security badge at a low cost and with excellent performance. According to another embodiment, the RFID transponder 182 and 186 is first formed, with or without a substrate, and then is attached to a badge blank 174 using an adhesive. Alternatively, the RFID transponder 182 and 186 is first formed, with or without a substrate, and is then laminated onto the badge blank 174.

The same process used for forming the RFID security badge of FIGS. 9a and 9b may be used to form an RFID key chain 200 as shown in FIG. 10. RFID key chain devices 200 are particularly useful as credit card or debit card substitutes and find particular application in retail gasoline sales wherein the customer has the vehicle key 220 attached via a chain 216 to the transponder 204. In the most preferred embodiment, the key chain background 204 and the RFID substrate 204 comprise the same material. That is, the RFID transponder 208 and 212 is formed onto the substrate 204 on the reverse side either before or after the key chain design, symbols and characters, and the like, is printed onto the front side. The simplified manufacturing process and excellent performance qualities of the conductive loaded resin-based RFID antenna 208 of the present invention provides the ability to form an effective, though very small, RFID transponder onto a key chain at a low cost and with excellent performance. According to another embodiment, the RFID transponder 208 and 212 is first formed, with or without a substrate, and then is attached to a key chain blank 204 using an adhesive. Alternatively, the RFID transponder 208 and 212 is first formed, with or without a substrate, and is then laminated onto the key chain blank 204.

Figure 11:
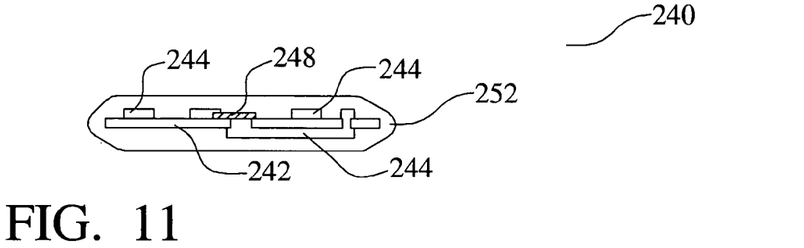
FIG. 11 illustrates a sixth preferred embodiment of the present invention showing an implantable capsule containing a RFID transponder comprising conductive loaded resin-based material.

Referring now to FIG. 11, a sixth preferred embodiment of the present invention is illustrated. An implantable identification capsule 240 is shown. Identification capsules are now commonly used to provide positive identification of domesticated farm animals and of household pets. In the case of dogs, for example, the capsule 240 is easily implanted into the loose skin in the neck/shoulder area. The capsule comprises a molded conductive loaded resin-based RFID antenna 244 and an identifier chip 248. The manufacturing method described above in FIGS. 7a through 7c is preferably used to form the RFID transponder which may or may not require a substrate. A biocompatible material 252, preferably comprising a biocompatible resin material, encapsulates the transponder 244 and 248.

Figure 12:
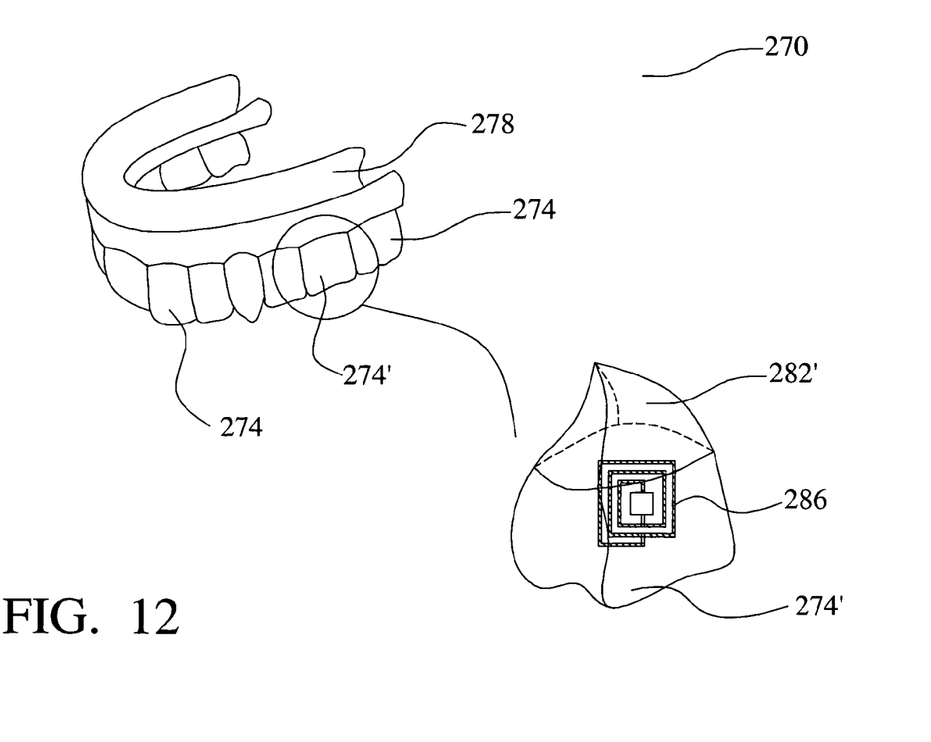
FIG. 12 illustrates a seventh preferred embodiment of the present invention showing a dental device with an integrated RFID transponder comprising conductive loaded resin-based material.

Referring now to FIG. 12, a seventh preferred embodiment of the present invention is illustrated. A dental device 270 is shown. The dental device 270 comprises a standard gum structure 270 with an array of false teeth 274. However, a RFID device 286 according to the present invention is embedded into one false tooth 274'. The RFID device 286 comprises the conductive loaded resin-based antenna as described herein and an identifier chip. The false tooth 274 is partially hollowed to accommodate the RFID transponder 286 within the tooth anchoring structure 282' and chewing surface 274'. The RFID dental device 270 is particularly useful for patient identification, particularly for those suffering from memory loss or for the deceased or for those under criminal detention, and for medical record keeping automation. According to another embodiment, the RFID device 286 is embedded into a single false tooth or into a dental appliance of a patient having other non-false teeth.

Figure 13:
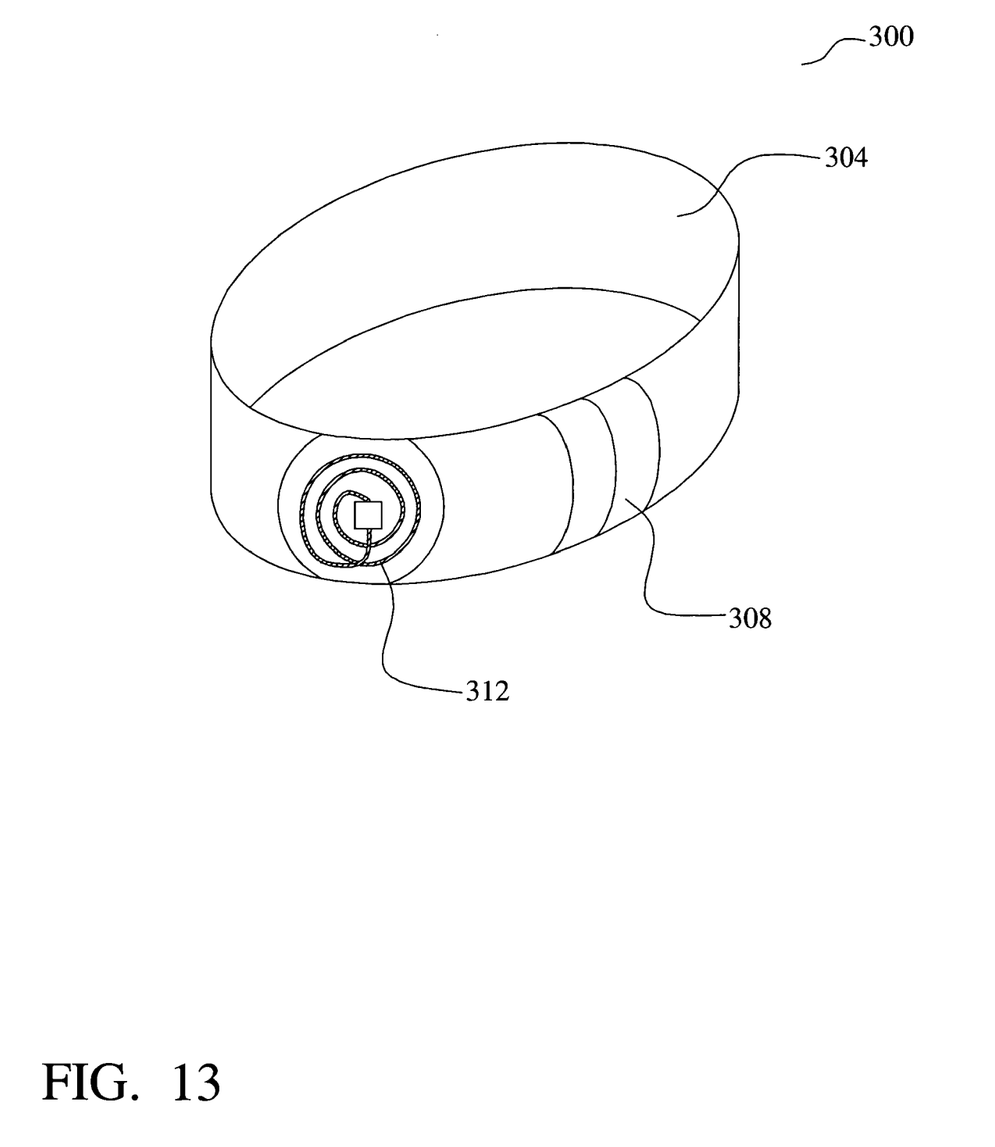
FIG. 13 illustrates an eighth preferred embodiment of the present invention showing a bracelet or collar with an integrated RFID transponder comprising conductive loaded resin-based material.

Referring now to FIG. 13, an eight preferred embodiment of the present invention is illustrated. An identity bracelet 300, or collar, is shown. The bracelet 300 contains an RFID transponder 312 comprising the conductive loaded resin-based material of the present invention as heretofore described. The bracelet 300, or collar, is designed to provide a positive identification for the bearer and may be advantageously used for prevention of infant/child abduction, tracking those criminally incarcerated, event access, and the like. According to one embodiment, the bracelet 300, or collar, comprises a single application latching mechanism 308 such that remove of the bracelet material 304 and 308 is only accomplished with a specialized tool. The advantageous features of the novel conductive loaded resin-based antenna 312 allow a RFID transponder of exceptional performance, even in close proximity to a human body.

Figure 2:
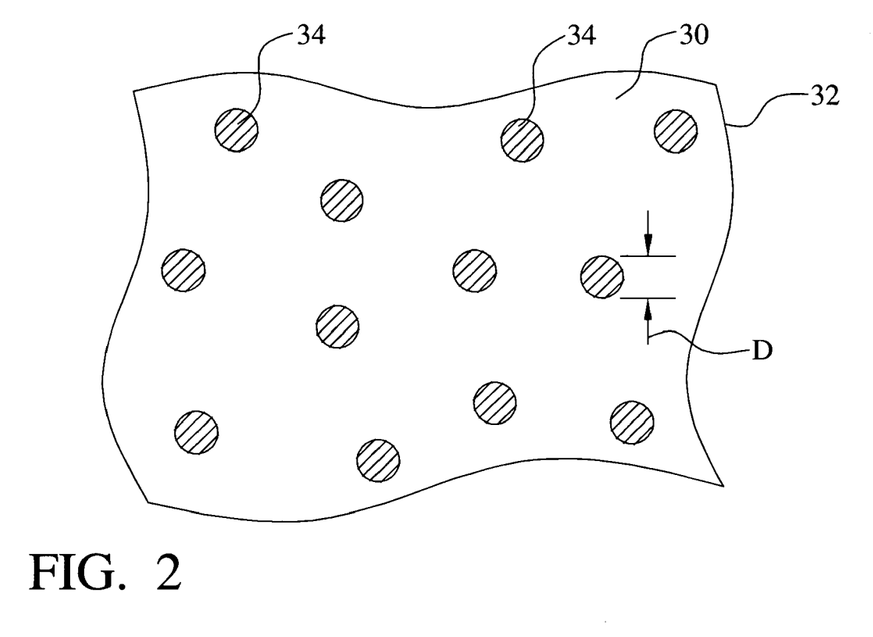
FIG. 2 illustrates a first preferred embodiment of a conductive loaded resin-based material wherein the conductive materials comprise a powder.

The conductive loaded resin-based material of the present invention typically comprises a micron powder(s) of conductor particles and/or in combination of micron fiber(s) homogenized within a base resin host. FIG. 2 shows cross section view of an example of conductor loaded resin-based material 32 having powder of conductor particles 34 in a base resin host 30. In this example the diameter D of the conductor particles 34 in the powder is between about 3 and 12 microns.

Figure 3:
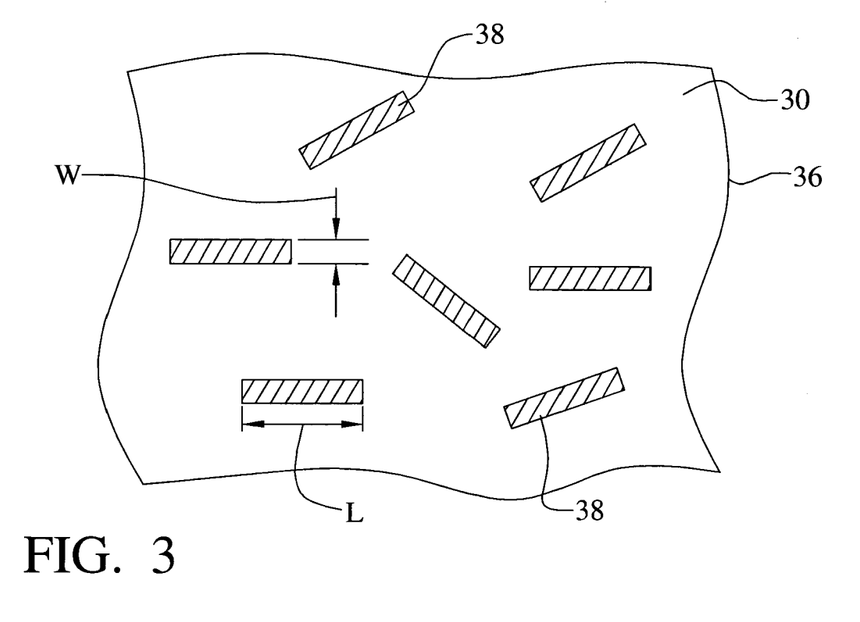
FIG. 3 illustrates a second preferred embodiment of a conductive loaded resin-based material wherein the conductive materials comprise micron conductive fibers.
Figure 4:
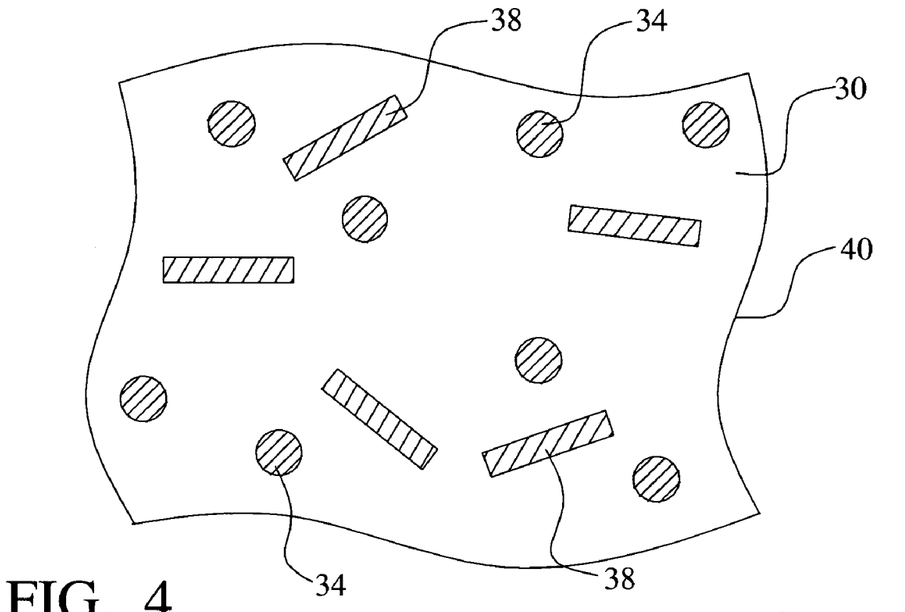
FIG. 4 illustrates a third preferred embodiment of a conductive loaded resin-based material wherein the conductive materials comprise both conductive powder and micron conductive fibers.

FIG. 3 shows a cross section view of an example of conductor loaded resin-based material 36 having conductor fibers 38 in a base resin host 30. The conductor fibers 38 have a diameter of between about 3 and 12 microns, typically in the range of 10 microns or between about 8 and 12 microns, and a length of between about 2 and 14 millimeters. The conductors used for these conductor particles 34 or conductor fibers 38 can be stainless steel, nickel, copper, silver, or other suitable metals or conductive fibers, or combinations thereof. These conductor particles and or fibers are homogenized within a base resin. As previously mentioned, the conductive loaded resin-based materials have a sheet resistance between about 5 and 25 ohms per square, though other values can be achieved by varying the doping parameters and/or resin selection. To realize this sheet resistance the weight of the conductor material comprises between about 20% and about 50% of the total weight of the conductive loaded resin-based material. More preferably, the weight of the conductive material comprises between about 20% and about 40% of the total weight of the conductive loaded resin-based material. More preferably yet, the weight of the conductive material comprises between about 25% and about 35% of the total weight of the conductive loaded resin-based material. Still more preferably yet, the weight of the conductive material comprises about 30% of the total weight of the conductive loaded resin-based material. Stainless Steel Fiber of 8–11 micron in diameter and lengths of 4–6 mm and comprising, by weight, about 30% of the total weight of the conductive loaded resin-based material will produce a very highly conductive parameter, efficient within any EMF spectrum. Referring now to FIG. 4, another preferred embodiment of the present invention is illustrated where the conductive materials comprise a combination of both conductive powders 34 and micron conductive fibers 38 homogenized together within the resin base 30 during a molding process.

Figure 5A:
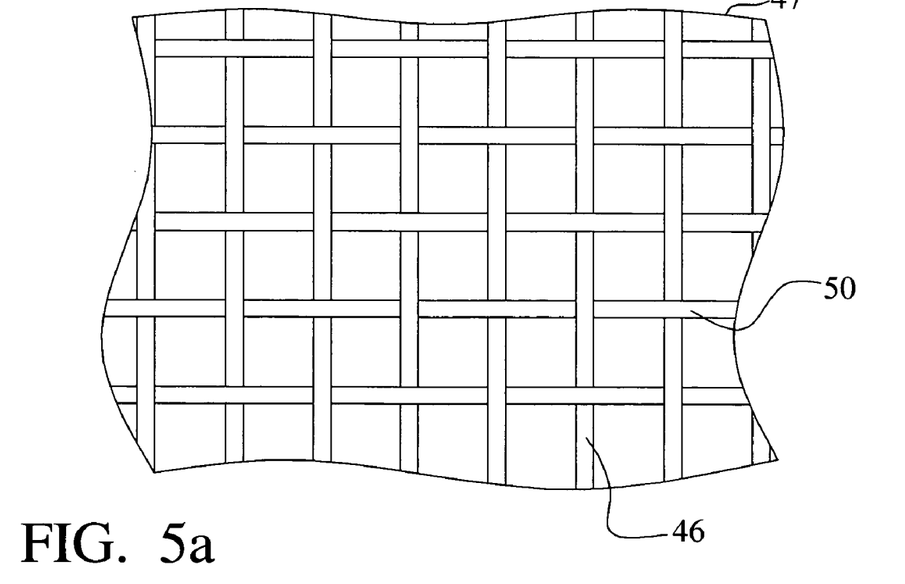
FIGS. 5a and 5b illustrate a fourth preferred embodiment wherein conductive fabric-like materials are formed from the conductive loaded resin-based material.
Figure 5B:
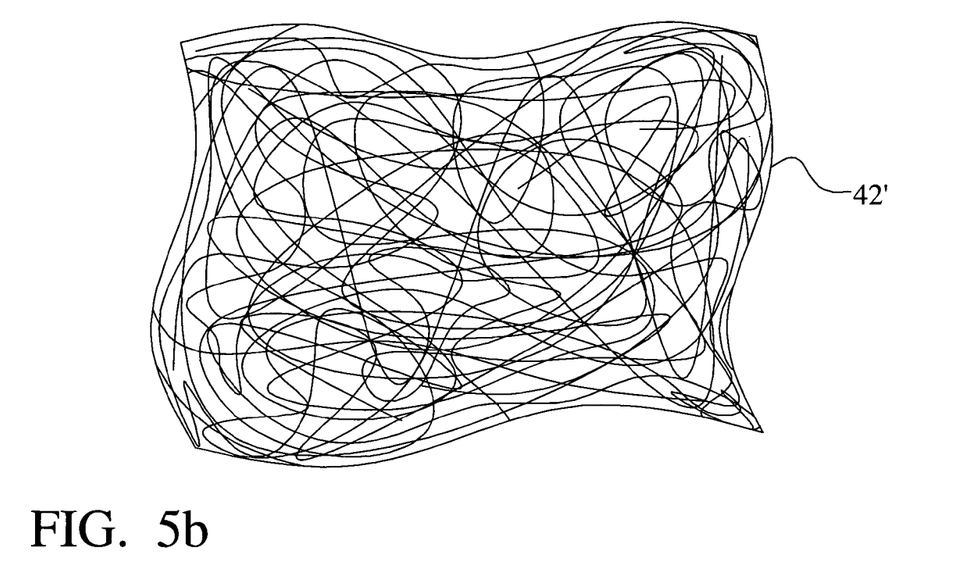

Referring now to FIGS. 5a and 5b, a preferred composition of the conductive loaded, resin-based material is illustrated. The conductive loaded resin-based material can be formed into fibers or textiles that are then woven or webbed into a conductive fabric. The conductive loaded resin-based material is formed in strands that can be woven as shown. FIG. 5a shows a conductive fabric 42 where the fibers are woven together in a two-dimensional weave 46 and 50 of fibers or textiles. FIG. 5b shows a conductive fabric 42' where the fibers are formed in a webbed arrangement. In the webbed arrangement, one or more continuous strands of the conductive fiber are nested in a random fashion. The resulting conductive fabrics or textiles 42, see FIG. 5a, and 42', see FIG. 5b, can be made very thin, thick, rigid, flexible or in solid form(s).

Similarly, a conductive, but cloth-like, material can be formed using woven or webbed micron stainless steel fibers, or other micron conductive fibers. These woven or webbed conductive cloths could also be sandwich laminated to one or more layers of materials such as Polyester(s), Teflon(s), Kevlar(s) or any other desired resin-based material(s). This conductive fabric may then be cut into desired shapes and sizes.

Figure 6A:
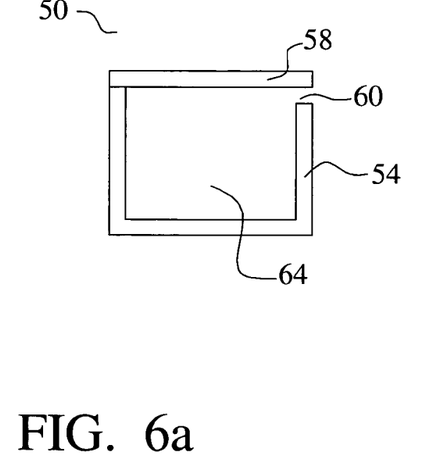
FIGS. 6a and 6b illustrate, in simplified schematic form, an injection molding apparatus and an extrusion molding apparatus that may be used to mold RFID antennas and transponder devices of a conductive loaded resin-based material.

RFID devices formed from conductive loaded resin-based materials can be formed or molded in a number of different ways including injection molding, extrusion or chemically induced molding or forming. FIG. 6a shows a simplified schematic diagram of an injection mold showing a lower portion 54 and upper portion 58 of the mold 50. Conductive loaded blended resin-based material is injected into the mold cavity 64 through an injection opening 60 and then the homogenized conductive material cures by thermal reaction. The upper portion 58 and lower portion 54 of the mold are then separated or parted and the RFID device is removed.

Figure 6B:
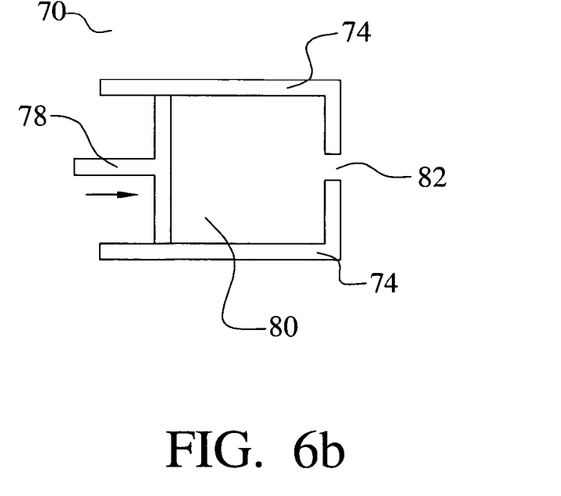

FIG. 6b shows a simplified schematic diagram of an extruder 70 for forming RFID devices using extrusion. Conductive loaded resin-based material(s) is placed in the hopper 80 of the extrusion unit 74. A piston, screw, press or other means 78 is then used to force the thermally molten or a chemically induced curing conductive loaded resin-based material through an extrusion opening 82 which shapes the thermally molten curing or chemically induced cured conductive loaded resin-based material to the desired shape. The conductive loaded resin-based material is then fully cured by chemical reaction or thermal reaction to a hardened or pliable state and is ready for use. Thermoplastic or thermosetting resin-based materials and associated processes may be used in molding the conductive loaded resin-based articles of the present invention.

The advantages of the present invention may now be summarized. An effective RFID device is achieved. A method to form a RFID device is also achieved. A RFID antenna is molded of conductive loaded resin-based materials. The characteristics of the RFID antenna molded of conductive loaded resin-based material can be altered or the visual characteristics can be altered by forming a metal layer over the conductive loaded resin-based material. Methods to fabricate a RFID device from a conductive loaded resin-based material incorporate various forms of the material. A method is achieved to fabricate a RFID device from a conductive loaded resin-based material where the material is in the form of a fabric. A variety of useful RFID devices are derived to take advantage of the excellent performance and ease of manufacture of the present invention.

As shown in the preferred embodiments, the novel methods and devices of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A RFID device comprising:
an identifier circuit; and
an antenna connected to said identifier circuit wherein said antenna comprises a conductive loaded, resin-based material comprising conductive materials in a base resin host.

2. The device according to claim 1 wherein the percent by weight of said conductive materials is between about 20% and about 50% of the total weight of said conductive loaded resin-based material.

3. The device according to claim 1 wherein the percent by weight of said conductive materials is between about 20% and about 40% of the total weight of said conductive loaded resin-based material.

4. The device according to claim 1 wherein the percent by weight of said conductive materials is between about 25% and about 35% of the total weight of said conductive loaded resin-based material.

5. The device according to claim 1 wherein said conductive materials comprise metal powder.

6. The device according to claim 5 wherein said metal powder is nickel, copper, or silver.

7. The device according to claim 5 wherein said metal powder is metal plated.

8. The device according to claim 7 wherein said metal plating is nickel, copper, silver, or alloys thereof.

9. The device according to claim 5 wherein said metal powder comprises a diameter of between about 3 μm and about 12 μm.

10. The device according to claim 1 wherein said conductive materials comprise non-metal powder.

11. The device according to claim 10 wherein said non-metal powder is carbon, graphite, or an amine-based material.

12. The device according to claim 1 wherein said conductive materials comprise a combination of metal powder and non-metal powder.

13. The device according to claim 1 wherein said conductive materials comprise micron conductive fiber.

14. The device according to claim 13 wherein said micron conductive fiber is nickel plated carbon fiber, or stainless steel fiber, or copper fiber, or silver fiber or combinations thereof.

15. The device according to claim 13 wherein said micron conductive fiber has a diameter of between about 3 μm and about 12 μm and a length of between about 2 mm and about 14 mm.

16. The device according to claim 13 wherein the percent by weight of said micron conductive fiber is between about 20% and about 40% of the total weight of said conductive loaded resin-based material.

17. The device according to claim 13 wherein said micron conductive fiber is stainless steel and wherein the percent by weight of said stainless steel fiber is between about 20% and about 40% of the total weight of said conductive loaded resin-based material.

18. The device according to claim 17 wherein said stainless steel fiber has a diameter of between about 3 μm and about 12 μm and a length of between about 2 mm and about 14 mm.

19. The device according to claim 1 wherein said conductive materials comprise a combination of conductive powder and conductive fiber.

20. The device according to claim 19 wherein said conductive fiber is stainless steel.

21. The device according to claim 1 wherein said base resin and said conductive materials comprise flame-retardant materials.

22. The device according to claim 1 wherein said identifier circuit comprises an integrated circuit device.

23. The device according to claim 1 wherein said antenna is spiral or serpentine shaped.

24. The device according to claim 1 wherein said connection of said antenna and said identifier circuit comprises bonding by a conductive epoxy.

25. The device according to claim 1 wherein said connection of said antenna and said identifier circuit comprises direct contact between said antenna and said identifier by molding.

26. The device according to claim 1 wherein said connection of said antenna and said identifier circuit comprises a metal layer between said antenna and said identifier circuit.

27. The device according to claim 1 wherein said connection of said antenna and said identifier circuit comprises a flexible circuit wherein said identifier circuit is attached to said flexible circuit and wherein said flexible circuit is molded into said antenna.

28. The device according to claim 1 further comprising a substrate wherein said antenna said identifier chip are molded to said substrate.

29. The device according to claim 28 wherein said substrate is not conductive.

30. The device according to claim 28 wherein said conductive loaded resin-based material is molded onto top and bottom sides of said substrate.

31. The device according to claim 30 wherein said substrate comprises through holes for connecting said top and bottom side conductive loaded resin-based material.

32. The device according to claim 28 wherein said substrate is a printable label.

33. The device according to claim 28 wherein said substrate is a badge blank.

34. The device according to claim 28 wherein said substrate is a key chain blank.

35. The device according to claim 1 further comprising an encapsulating layer containing said antenna and said identifier device.

36. The device according to claim 37 wherein said encapsulating layer is biocompatible for insertion into an animal body or a human body.

37. The device according to claim 1 further comprising a substrate wherein said antenna and said identifier device are adhered to said substrate.

38. The device according to claim 37 wherein said substrate is printable.

39. The device according to claim 1 further comprising a false tooth wherein said antenna and said identifier device are adhered to said false tooth.

40. The device according to claim 1 further comprising a bracelet device wherein said antenna and said identifier device are fixably mounted onto said bracelet device.

41. A RFID device comprising:
an identifier circuit; and
an antenna connected to said identifier circuit wherein said antenna comprises a conductive loaded, resin-based material comprising conductive materials in a base resin host and wherein the percent by weight of said conductive materials is between about 20% and about 50% of the total weight of said conductive loaded resin-based material.

42. The device according to claim 41 wherein the percent by weight of said conductive materials is between about 20% and about 40% of the total weight of said conductive loaded resin-based material.

43. The device according to claim 41 wherein the percent by weight of said conductive materials is between about 25% and about 35% of the total weight of said conductive loaded resin-based material.

44. The device according to claim 41 wherein said conductive materials comprise metal powder.

45. The device according to claim 44 wherein said metal powder is metal plated.

46. The device according to claim 44 wherein said metal powder comprises a diameter of between about 3 μm and about 12 μm.

47. The device according to claim 41 wherein said conductive materials comprise non-metal powder.

48. The device according to claim 41 wherein said conductive materials comprise a combination of metal powder and non-metal powder.

49. The device according to claim 41 wherein said conductive materials comprise micron conductive fiber.

50. The device according to claim 49 wherein said micron conductive fiber has a diameter of between about 3 μm and about 12 μm and a length of between about 2 mm and about 14 mm.

51. The device according to claim 49 wherein the percent by weight of said micron conductive fiber is between about 20% and about 40% of the total weight of said conductive loaded resin-based material.

52. The device according to claim 49 wherein said micron conductive fiber is stainless steel and wherein the percent by weight of said stainless steel fiber is between about 20% and about 40% of the total weight of said conductive loaded resin-based material.

53. The device according to claim 52 wherein said stainless steel fiber has a diameter of between about 3 μm and about 12 μm and a length of between about 2 mm and about 14 mm.

54. The device according to claim 41 wherein said conductive materials comprise a combination of conductive powder and conductive fiber.

55. The device according to claim 54 wherein said conductive fiber is stainless steel.

56. The device according to claim 41 wherein said base resin and said conductive materials comprise flame-retardant materials.

57. The device according to claim 41 wherein said connection of said antenna and said identifier circuit comprises bonding by a conductive epoxy.

58. The device according to claim 41 wherein said connection of said antenna and said identifier circuit comprises direct contact between said antenna and said identifier circuit by molding.

59. The device according to claim 41 wherein said connection of said antenna and said identifier circuit comprises a metal layer between said antenna and said identifier circuit.

60. The device according to claim 41 further comprising a substrate wherein said antenna is molded to said substrate.

61. The device according to claim 60 wherein said substrate is not conductive.

62. The device according to claim 60 wherein said conductive loaded resin-based material is molded onto top and bottom sides of said substrate.

63. The device according to claim 60 wherein said substrate comprises through holes for connecting said top and bottom side conductive loaded resin-based material.

64. The device according to claim 60 wherein said substrate is a printable label.

65. The device according to claim 60 wherein said substrate is a badge blank.

66. The device according to claim 60 wherein said substrate is a key chain blank.

67. The device according to claim 41 further comprising an encapsulating layer containing said antenna and said identifier device.

68. The device according to claim 67 wherein said encapsulating layer is biocompatible for insertion into an animal body or a human body.

69. The device according to claim 41 further comprising a substrate wherein said antenna and said identifier device are adhered to said substrate.

70. The device according to claim 69 wherein said substrate is printable.

71. The device according to claim 41 further comprising a false tooth wherein said antenna and said identifier device are adhered to said false tooth.

72. The device according to claim 41 further comprising a bracelet device wherein said antenna and said identifier device are fixably mounted onto said bracelet device.

73. A method to form a RFID device, said method comprising:

providing an identifying device;

providing a conductive loaded, resin-based material comprising conductive materials in a resin-based host;

molding said conductive loaded, resin-based material to form an antenna device; and connecting said antenna device to said identifying device.

74. The method according to claim 73 wherein the percent by weight of said conductive materials is between about 20% and about 40% of the total weight of said conductive loaded resin-based material.

75. The method according to claim 73 wherein said conductive materials comprise micron conductive fiber.

76. The method according to claim 75 wherein said micron conductive fiber is nickel plated carbon fiber, or stainless steel fiber, or copper fiber, or silver fiber or combinations thereof.

77. The method according to claim 75 wherein said micron conductive fiber has a diameter of between about 3 μm and about 12 μm and a length of between about 2 mm and about 14 mm.

78. The method according to claim 75 wherein the percent by weight of said micron conductive fiber is between about 20% and about 40% of the total weight of said conductive loaded resin-based material.

79. The method according to claim 75 wherein said micron conductive fiber is stainless steel and wherein the percent by weight of said stainless steel fiber is between about 20% and about 40% of the total weight of said conductive loaded resin-based material.

80. The method according to claim 79 wherein said stainless steel fiber has a diameter of between about 3 μm and about 12 μm and a length of between about 2 mm and about 14 mm.

81. The method according to claim 73 wherein said conductive materials comprise conductive powder.

82. The method according to claim 73 wherein said conductive materials comprise a combination of conductive powder and conductive fiber.

83. The method according to claim 73 wherein said step of connecting occurs during said step of molding.

84. The method according to claim 73 wherein said step of connecting comprises:

soldering said identifier device to a flexible circuit; and molding said flexible circuit into said antenna device.

85. The method according to claim 73 wherein said step of connecting comprises:

forming a metal layer overlying said antenna device; and soldering said identifier circuit to said antenna device.

86. The method according to claim 73 wherein said molding comprises:

injecting said conductive loaded, resin-based material into a mold;

curing said conductive loaded, resin-based material; and removing said RFID device from said mold.

87. The method according to claim 73 wherein said molding comprises:

loading said conductive loaded, resin-based material into a chamber;

extruding said conductive loaded, resin-based material out of said chamber through a shaping outlet; and curing said conductive loaded, resin-based material to form said antenna device.

88. The method according to claim 73 further comprising providing a substrate wherein said antenna device is molded to said substrate.

89. The method according to claim 88 wherein said substrate is non-conductive.

90. The method according to claim 89 wherein said conductive loaded resin-based material is molded to top and bottom sides of said substrate.

91. The method according to claim 88 further comprising printing onto said substrate.

92. The method according to claim 88 mounting a picture on said substrate.

93. The method according to claim 73 further comprising forming an encapsulating layer to contain said antenna and said identifier device.

94. The method according to claim 93 wherein said encapsulating layer is biocompatible for insertion into an animal body or a human body.

95. The method according to claim 73 further comprising adhering said antenna and said identifier device to a substrate.

96. The method according to claim 95 further comprising printing onto said substrate.

97. The method according to claim 73 further comprising adhering said antenna and said identifier device to said false tooth.

98. The method according to claim 73 further comprising fixably mounting said antenna and said identifier device onto a bracelet device.

* * * * *